(12) United States Patent
Lee et al.

(10) Patent No.: US 7,679,954 B2
(45) Date of Patent: Mar. 16, 2010

(54) PHASE CHANGE MEMORY APPARATUS HAVING AN IMPROVED CYCLING ENDURANCE AND PROGRAMMING METHOD THEREFOR

(75) Inventors: Suyoun Lee, Gyeonggi-do (KR); Byung-ki Cheong, Seoul (KR); Jeung-hyun Jeong, Seoul (KR); Taek Sung Lee, Seoul (KR); Won Mok Kim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 12/318,365

(22) Filed: Dec. 29, 2008

(65) Prior Publication Data

US 2009/0168504 A1 Jul. 2, 2009

Related U.S. Application Data

(63) Continuation of application No. PCT/KR2007/006958, filed on Dec. 28, 2007.

(51) Int. Cl.
*G11C 11/00* (2006.01)
(52) U.S. Cl. .................. 365/163; 365/148; 365/100
(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | |
|---|---|---|---|
| 5,359,205 A | 10/1994 | Ovshinsky | |
| 5,414,271 A | 5/1995 | Ovshinsky et al. | |
| 5,534,712 A | 7/1996 | Ovshinsky et al. | |
| 5,536,947 A | 7/1996 | Klersy et al. | |
| 7,394,089 B2 * | 7/2008 | Doyle et al. | 257/4 |
| 7,491,965 B2 * | 2/2009 | Doyle et al. | 257/4 |
| 7,545,667 B2 * | 6/2009 | Elmegreen et al. | 365/148 |
| 2006/0097240 A1 * | 5/2006 | Lowrey et al. | 257/5 |
| 2007/0153571 A1 | 7/2007 | Elkins et al. | |
| 2007/0217253 A1 | 9/2007 | Kim et al. | |
| 2007/0279975 A1 | 12/2007 | Hudgens | |

OTHER PUBLICATIONS

S.R. Ovshinsky "Innovation Providing New Multiple Functions in Phase-Change Materials to Achieve Cognitive Computing", Tutorials in 2003 Material Research Society Fall Meeting.

(Continued)

*Primary Examiner*—Richard Elms
*Assistant Examiner*—Harry W Byrne
(74) *Attorney, Agent, or Firm*—Bacon & Thomas, PLLC

(57) ABSTRACT

A phase change memory apparatus includes a phase change memory array in which a plurality of phase change memory devices are arranged, and a pulse generator that supplies a writing current pulse, an erasure current pulse, and a reverse repair current pulse to the phase change memory devices in the phase change memory array. The reverse repair current pulse has opposite direction to the writing current pulse and the erasure current pulse of the phase change memory devices, and is of such a size that resultant Joule heat and electromigration move the elements of the reverse repair current pulse. The reverse repair current pulse has a width equal to or more than a smaller one of duration of a normal writing operation and duration of a normal erasure operation.

13 Claims, 11 Drawing Sheets

OTHER PUBLICATIONS

Stefan Lai "Current Status of Phase Change Memory and Its Future", IEDM Tech. Dig., 2003, pp. 255-258.

J.H. Oh et al, "Full Integration of Highly Manufacturable 512 Mb PRAM Based on 90nm Technology" IEDM Tech. Dig., 2006., 346905.

Jong-Bong Park et al "Phase-Change Behavior of Stoichiometric $Ge_2Sb_2Te_5$ in Phase-Change Random Access Memory", Jour. Electrochem. Soc. 154, H139, 2007.

Kinam Kim et al. "Reliability Investigations for Manufacturable High Density PRAM", Proc. Of the 43rd International Reliability Physics Symposium, pp. 157-162, 2005.

* cited by examiner

PHASE CHANGE MEMORY APPARATUS HAVING AN IMPROVED CYCLING ENDURANCE AND PROGRAMMING METHOD THEREFOR

This application is a continuation application of pending PCT application Ser. No. PCT/KR07/06958, filed Dec. 28, 2007 (of which the entire disclosure of the pending, prior application is hereby incorporated by reference).

TECHNICAL FIELD

The present invention relates to a semiconductor memory device, and in particular, to a phase change memory apparatus, which is capable of improving cycling endurance of phase change memory devices, and to a programming method for the phase change memory apparatus.

BACKGROUND ART

Phase change memory devices, such as phase change RAM (Random Access Memory), use as nonvolatile data a difference in electrical resistivity due to a reversible phase change between amorphous and crystalline in a phase change material of chalcogenide series. Such phase change memory devices have been suggested by Ovonyx, Inc. and ECD (Energy Conversion Devices), Inc. in U.S.A. (see U.S. Pat. Nos. 5,359,205, 5,414,271, 5,536,947, and 5,534,712).

A writing operation of a memory, which is also referred to as "reset", changes the phase of a phase change material in a phase change memory device to an amorphous state. During the writing operation, the phase change material is heated to a melting point or more using Joule heat produced by an electrical pulse, and is then rapidly quenched. In this way, the phase change material in the phase change memory device is changed to the amorphous state. This state is called a reset state, in which electrical resistance is high.

An erasure operation of a memory, which is also referred to as "set", changes the phase of the phase change material to a crystalline state. During the erasure operation, thermal energy is supplied to the phase change material in accordance with Joule heat produced by an electrical pulse, and the phase change material is heated to a crystallization temperature or more and then maintained for a predetermined time or more. In this way, the phase change material in the amorphous state is changed to a crystalline state. This state is called "set state", in which electrical resistance is low.

A reading operation of a memory is performed by reading resistance of the phase change memory device or a change in voltage across a bit line.

Similarly to other semiconductor memory devices, the phase change memory device has a limited writing life time. At the beginning of development, it has been reported that the writing life time of the phase change memory device is about 1013 (see S. R. Ovshinsky, Tutorials in 2003 Material Research Society Fall Meeting).

FIG. 1 shows a test result of cycling endurance of a phase change memory device (see Stefan Lai, IEDM Tech. Dig., 2003, pp. 255-258).

Advancement of device integration causes a decrease in cycling endurance of the phase change memory device. A latest report shows that the cycling endurance of the phase change memory is about 105, which is much the same as a flash memory (see J. H. Oh et. al., in IEDM Tech. Dig., 2006, 346905).

In regard to a phase change memory device that is put into an unwritable state due to repetition of the writing and erasure operations, an analysis result shows that the unwritable state is caused by a change in composition of the phase change material (see Jong-Bong Park et. al., Jour. Electrochem. Soc. 154, H139). The writing and erasure operations of the phase change memory device are accompanied by heat and high current. Heat and high current lead to thermal atomic diffusion or collision against electrons at high temperature, resulting in electromigration. The electromigration causes the movement of atoms of the phase change material, resulting in a change in composition of the phase change material.

DISCLOSURE

[Technical Problem]

It is a primary object of the present invention to provide a phase change memory apparatus, which is capable of improving cycling endurance of a phase change memory device, which is put into an unwritable state due to repetition of writing and erasure operations, and a programming method therefor.

It is another object of the present invention to provide a phase change memory apparatus, which is capable of preventing a phase change memory device from being putting into an unwritable state, and a programming method therefor.

[Technical Solution]

According to an aspect of the invention, a phase change memory apparatus includes a phase change memory array in which a plurality of phase change memory devices are arranged, and a pulse generator that supplies a writing current pulse, an erasure current pulse, and a reverse repair current pulse to the phase change memory devices in the phase change memory array.

According to another aspect of the present invention, a programming method for a phase change memory apparatus having a plurality of phase change memory devices includes supplying writing and erasure current pulses for writing and erasure operations of the phase change memory devices, and selectively supplying a reverse repair current pulse having a polarity opposite to those of the writing and erasure current pulses.

The reverse repair current pulse may be of such a size that resultant Joule heat and electromigration may cause movement of elements of a phase change material in the phase change memory devices. The reverse repair current pulse may have a width equal to or more than a smaller one of the duration of the writing current pulse of the phase change memory device and the duration of the erasure current pulse.

The reverse repair current pulse may be supplied at every predetermined time interval after the writing current pulse or the erasure current pulse is supplied, or may be supplied each time a predetermined number of writing current pulse or erasure current pulses are supplied.

[Advantageous Effects]

According to the phase change memory apparatus using the reverse repair current pulse and the programming method therefor of the present invention, the elements of the phase change material in the phase change memory devices moved due to the repetition of the writing and erasure operations are returned to the initial states. Therefore, the cycling endurance of the phase change memory devices can be repaired so as to

BEST MODE

Hereinafter, an exemplary embodiment of the present invention will be described with reference to the accompanying drawings, in which like numbers reference like elements.

Prior to a phase change memory apparatus having a repair function of a phase change memory device according to the present invention, the principle of the present invention will be described with reference to FIGS. 2a and 2b.

Figure 1:
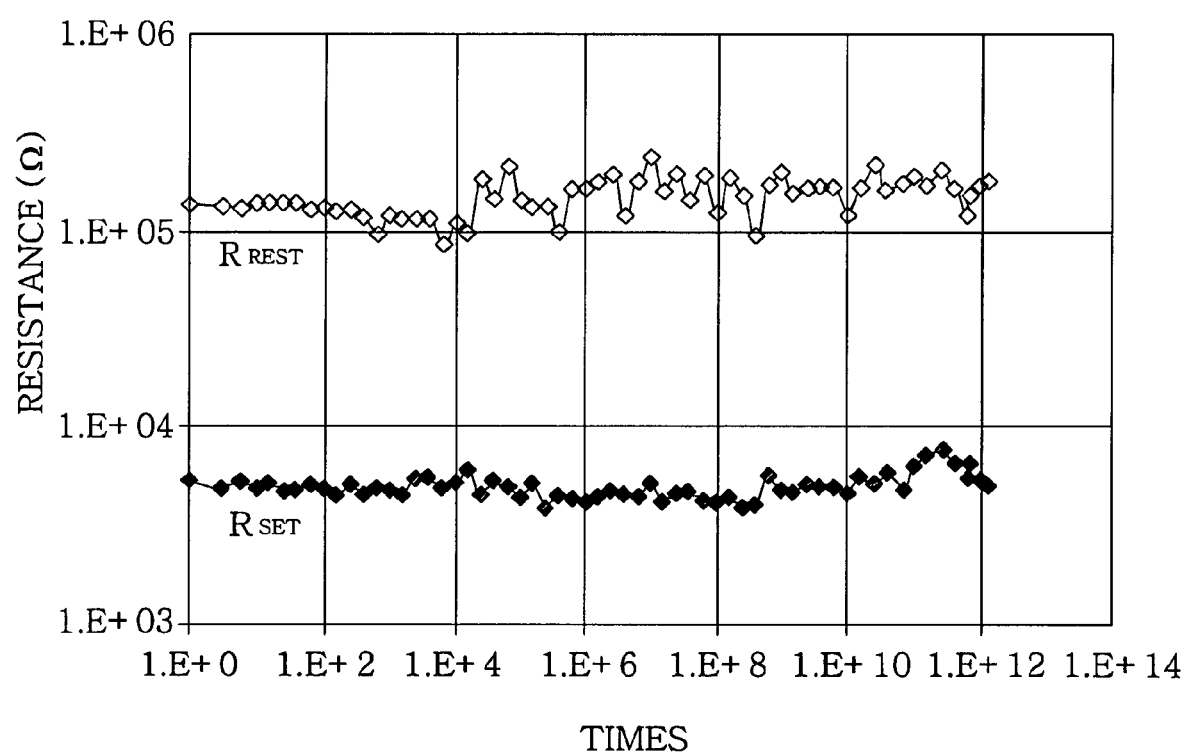
FIG. 1 shows an example of a test result of cycling endurance of a phase change memory device.
Figure 2A:
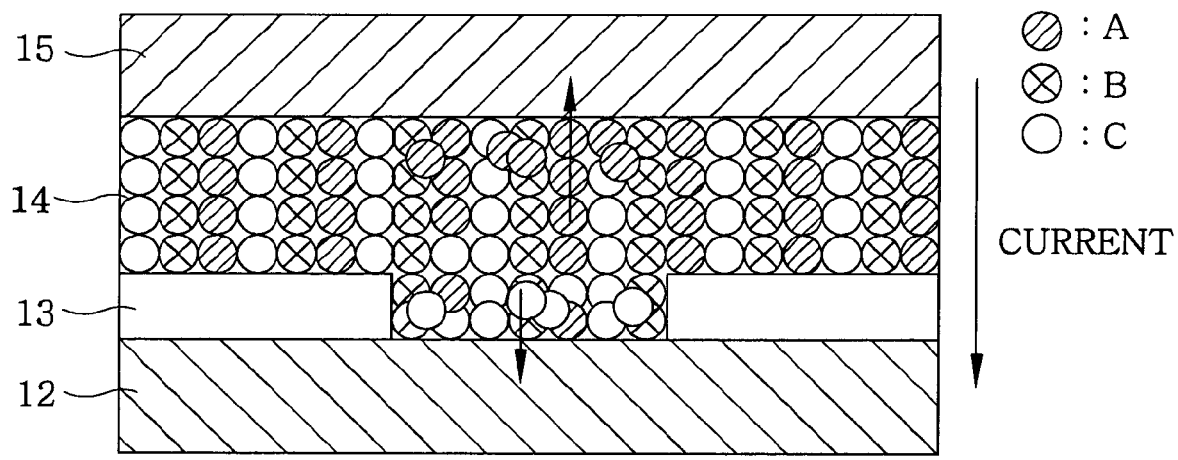
FIG. 2a is a schematic view illustrating the movement of atoms of a phase change material due to high current and heat during writing and erasure operations of a phase change memory device.
Figure 2B:
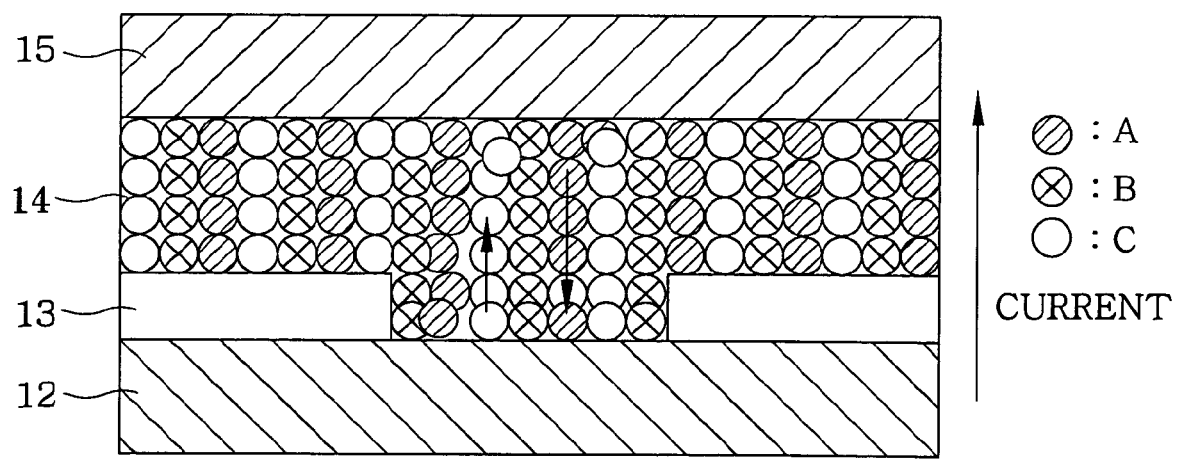
FIG. 2b is a diagram illustrating a process for repairing the state of a phase change memory device to an initial state by applying a current in the form of a reverse repair current pulse according to the present invention.

A phase change memory device shown in FIGS. 2a and 2b includes lower and upper electrodes 12 and 15 made of a conductor, and a phase change material layer 14 interposed between the lower electrode 12 and the upper electrode 15. In FIGS. 2a and 2b, reference numeral 13 denotes an insulating layer.

The phase change material layer 14 contains a material which is reversibly switched between two states, that is, a crystalline state and an amorphous state, by an electrical signal applied to the lower and upper electrodes 12 and 15, for example, a current control pulse.

As described above, during the writing and erasure operations of the phase change memory device, a phase change occurs at high temperature by large current density, and the phase change may lead to electromigration. FIG. 2a is a schematic view illustrating the movement of atoms of a phase change material of a phase change memory device during the writing and erasure operations of the phase change memory device. For convenience, in FIG. 2a, it is assumed that an atom "A" moves in a direction opposite to an electric field, and an atom "C" moves in a direction identical to the electric field. If the movement of the atoms is accumulated due to repetition of the writing and erasure operations, as shown in FIG. 2a, it may be expected that the elements in the phase change material layer 14 are unevenly arranged. The unevenness of the atoms in the phase change material layer 14 was experimentally verified (see Kinam Kim et. al., Proc. of the 43rd International Reliability Physics Symposium, pp. 157~162). In this state, the phase change memory device has a characteristic different from that in an initial state thereof. For this reason, the phase change memory device may be erroneously operated.

As shown in FIG. 2a, when the movement of the atoms is caused by electromigration, if a current pulse applied to the phase change memory device is reversed to reverse a direction in which the electrons move, the atoms moved due to collision against electrons can be expected to be returned or close to the initial states. In this specification, such a current pulse is referred to as a reverse repair current pulse.

FIG. 2b illustrates a case in which the atoms of the phase change material in the phase change memory device are repaired to the initial states by applying a reverse repair current pulse according to the present invention.

Figure 3:
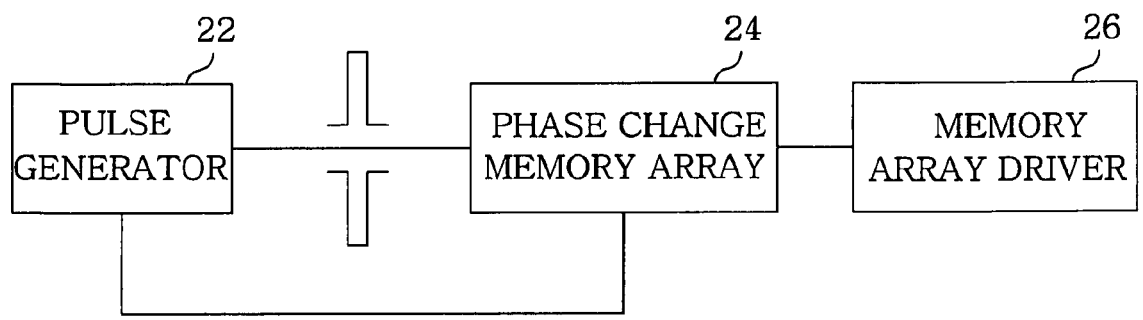
FIG. 3 is a block diagram of a phase change memory apparatus according to an embodiment of the present invention.

Referring to FIG. 3, there is illustrated a phase change memory apparatus according to an embodiment of the present invention.

As shown in FIG. 3, the phase change memory apparatus of the present invention includes a pulse generator 22, a phase change memory array 24, and a memory array driver 26.

The phase change memory array 24 includes a plurality of phase change memory devices arranged in a matrix at intersections of word lines and bit lines.

The memory array driver 26 selectively drives a specific phase change memory device or phase change memory devices in a line from among a plurality of phase change memory devices arranged in a matrix.

The pulse generator 22 generates a control pulse for the writing and erasure operations of the phase change memory device(s) in the phase change memory array 24 selected by the memory array driver 26, and a reverse repair current pulse.

Conventionally, during the normal operation of the phase change memory device, a positive voltage is applied to the upper electrode, and a negative voltage is applied to the lower electrode. Therefore, a current flows from the upper electrode to the lower electrode. This is, but not intended to limit the present invention, just ease of understanding.

Figure 4A:
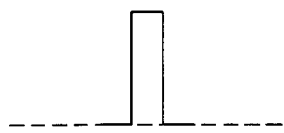
FIGS. 4a, 4b and 4c is a diagram illustrating a writing current pulse and an erasure current pulse in a phase change memory device shown in FIG. 3, and a reverse repair current pulse for repairing cycling endurance of a phase change memory device according to an embodiment of the present invention.
Figure 4B:
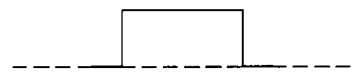
Figure 4C:
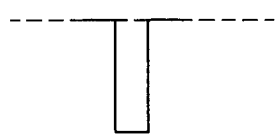

According to the embodiment of the present invention, the pulse generator 22 generates a writing current pulse, an erasure current pulse, and a reverse repair current pulse, as shown in FIGS. 4a, 4b and 4c. The writing current pulse of FIG. 4a and the erasure current pulse of FIG. 4b are pulses which are used to change the phase change material in the phase change memory device to the amorphous state or the crystalline state. The reverse repair current pulse of FIG. 4c is a current pulse which has a polarity opposite to a current pulse applied to the upper electrode and the lower electrode.

As described with reference to FIG. 2b, when thermal diffusion or collision against electrons at high temperature causes electromigration during the writing and erasure operations of the phase change memory device, the atoms of the phase change material are moved due to electromigration. And thus, the phase change material is changed in composition and is then put into an unwritable state. The reverse repair current pulse repairs the phase change memory device having unwritable state. For this reason, the pulse generator 22 is formed of a bidirectional pulse generator that is capable of supplying currents to the phase change memory device in both directions.

According to the embodiment of the present invention, the pulse generator 22 may selectively supply the reverse repair current pulse after the writing and erasure current pulses. For example, the reverse repair current pulse may be supplied at every predetermined time interval after the normal writing and erasure current pulses are supplied, or may be supplied each time a predetermined number of normal writing or erasure current pulses are supplied.

Alternatively, the pulse generator 22 may read reset resistance according to a reset current at every predetermined time interval during the writing and erasure operations of the phase change memory device by the normal writing and erasure current pulses, and accordingly may determine whether or not to apply the reverse repair current pulse.

In this specification, the reverse repair current pulse is a square wave, but it will be appreciated by those skilled in the art that other waves, for example a triangular wave and a sinusoidal wave, may be used.

Figure 5:
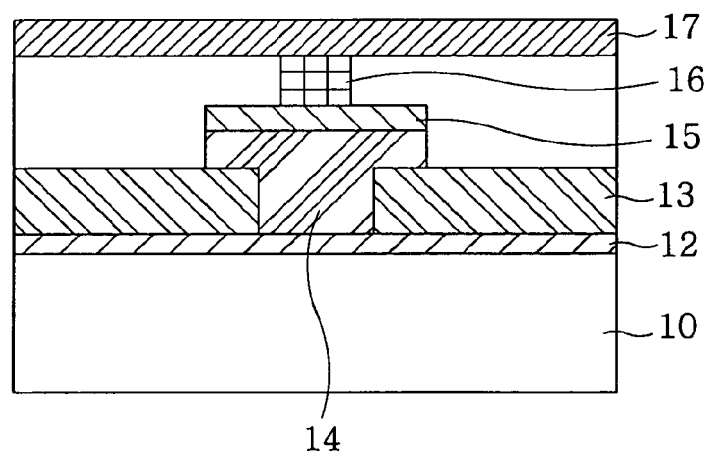
FIG. 5 is a schematic sectional view of a test sample of a phase change memory device to which an embodiment of the present invention is to be applied.

FIG. 5 is a schematic sectional view of a phase change memory device in which the present invention is to be embodied.

As shown in FIG. 5, $SiO_2$ 11 is formed on a silicon substrate 10 by a thermal process, and Ti and TiN are deposited on the substrate 10 by sputtering to have a thickness of 100 nm, respectively. Thus, a lower electrode layer 12 is formed. Next, the lower electrode layer 12 is patterned by photolithography and wet etching to thereby form a lower electrode pattern.

Next, $SiO_2$ is deposited by PECVD to have a thickness of 70 nm with TEOS (Tetraethoxysilane) and oxygen as a source, thereby forming an interlayer insulating layer 13. A contact hole having, for example, a diameter ranging from 50 nm to 500 nm is formed in the interlayer insulating layer 13 vertically by electron beam lithography and RIE (reactive ion etching) dry etching to thereby expose the lower electrode layer 12.

Next, a heat treatment is performed at an atmosphere of 350 □ for 30 minutes while nitrogen gas is supplied, and a phase change material is deposited by RF sputtering to have a thickness of 300 nm, thereby forming the phase change material layer 14 is formed. Next, TiN for forming the upper electrode 15 is deposited on the phase change material layer 14 to have a thickness of 50 nm. The composition of the phase change material in this experiment is $Ge_{23.23}Sb_{24.12}Te_{52.65}$ which is widely used in manufacturing a phase change memory device. However, the composition of the phase change material is just for illustrate, but the present invention is not limited thereto.

Next, the upper electrode 15 and the phase change material 14 are patterned by photolithography and dry etching.

Next, a metal, for example, aluminum (Al) is patterned by a lift-off method to form a lead 17 of the upper electrode 15.

Finally, in order to prevent the phase change memory device from being deteriorated, silicon oxide ($SiO_2$) (not shown) is deposited by PECVD to have a thickness of 100 nm, and a pad open process for measuring electrical characteristics is performed. Thus, a phase change memory device shown in FIG. 6 is manufactured.

Figure 6:
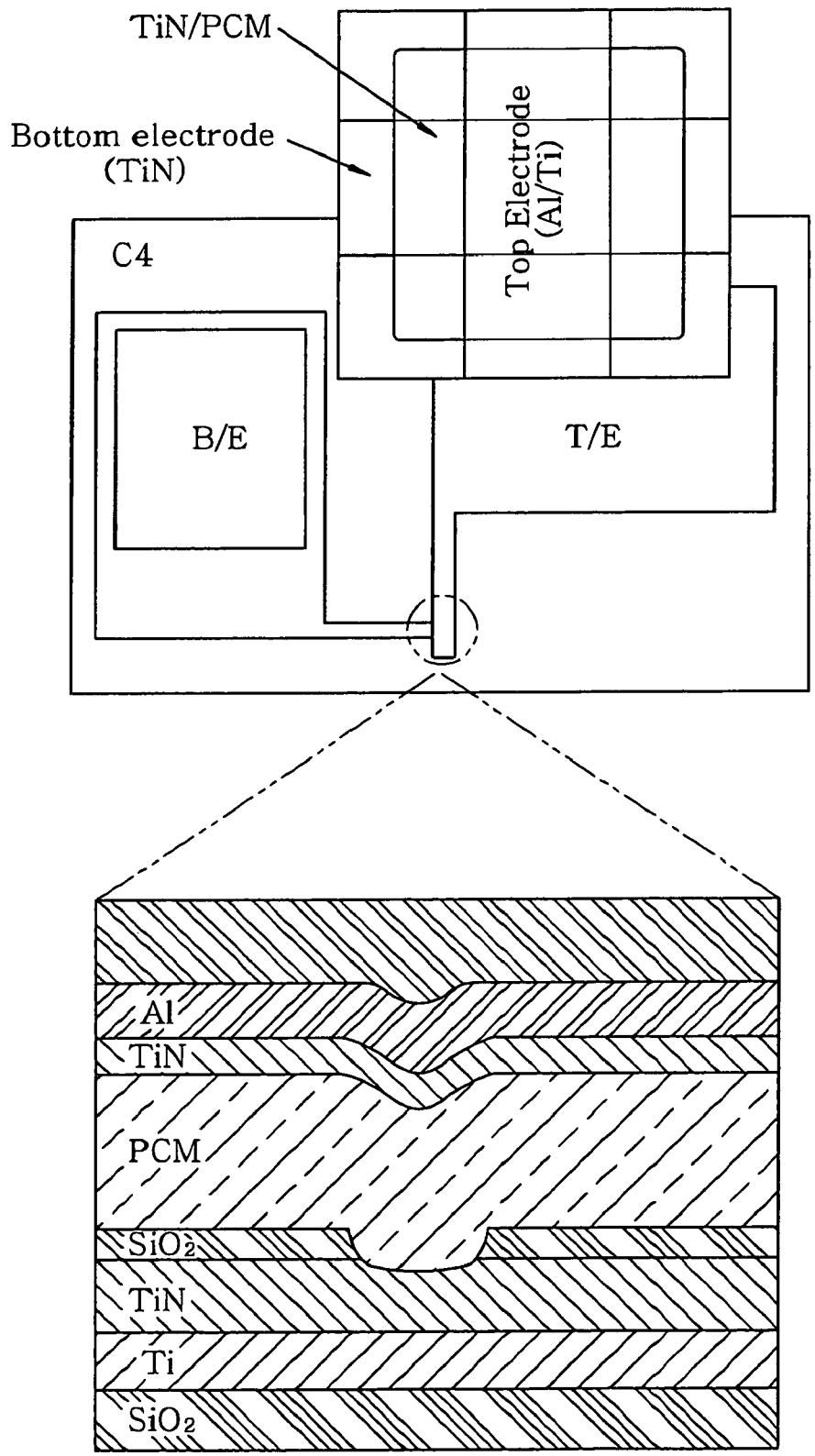
FIG. 6 is a plan view and a sectional view of a phase change memory device of FIG. 5.
Figure 7:
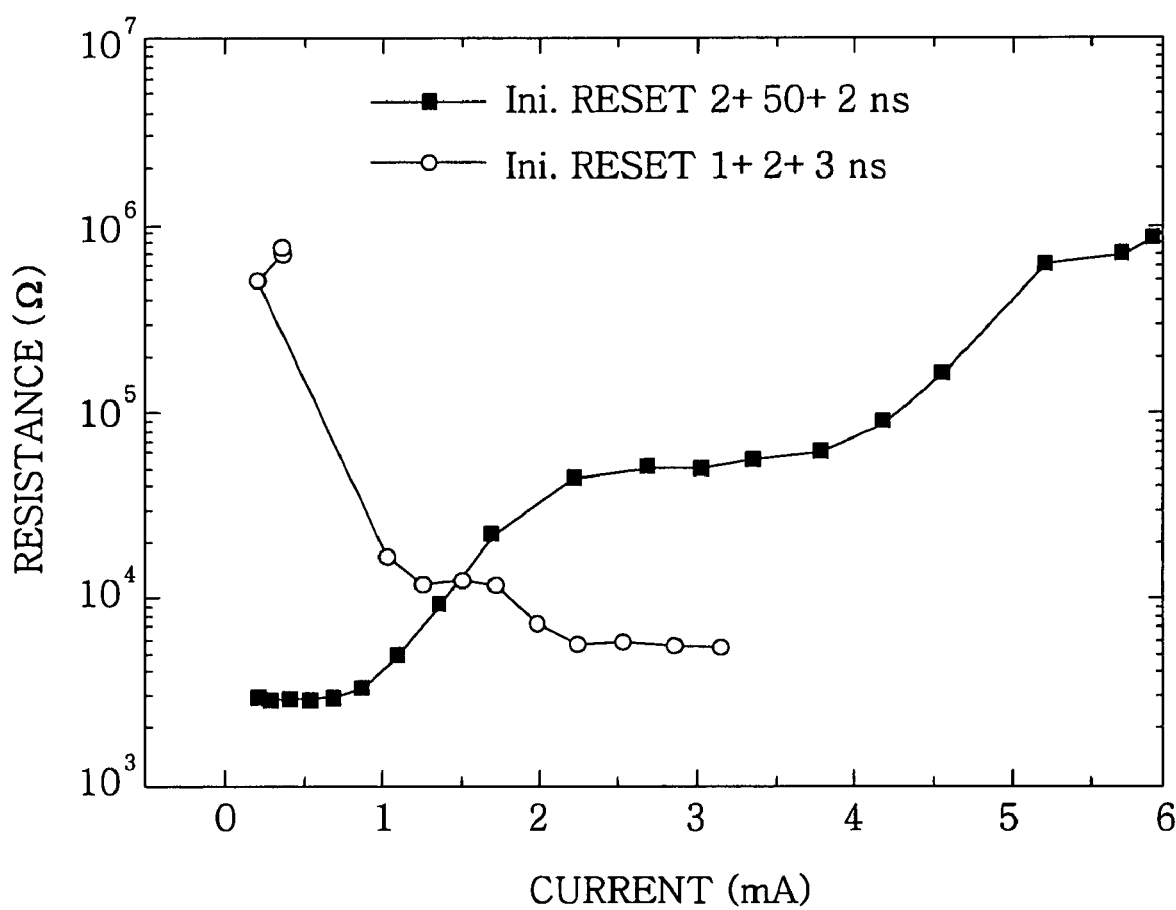
FIG. 7 is a current-resistance characteristic curve during reset and set operations in an initial state of a phase change memory device shown in FIG. 6.

FIG. 7 illustrates a current-resistance characteristic curve during reset and set operations in an initial state of the phase change memory device shown in FIG. 6. Referring to FIG. 7, the current-resistance characteristic curve is obtained by applying a voltage-increasing pulse to the phase change memory device and measuring a change in resistance of the phase change memory device. The current-resistance characteristic curve ensures finding of conditions for the writing and erasure operations of the phase change memory device. That is, it can be seen from the current-resistance characteristic curve that the reset operation of the phase change memory device occurs at approximately 4.5 mA and 2+50+2 ns, and the set operation occurs at approximately 1.0 mA and 1+2+3 μs.

Figure 8:
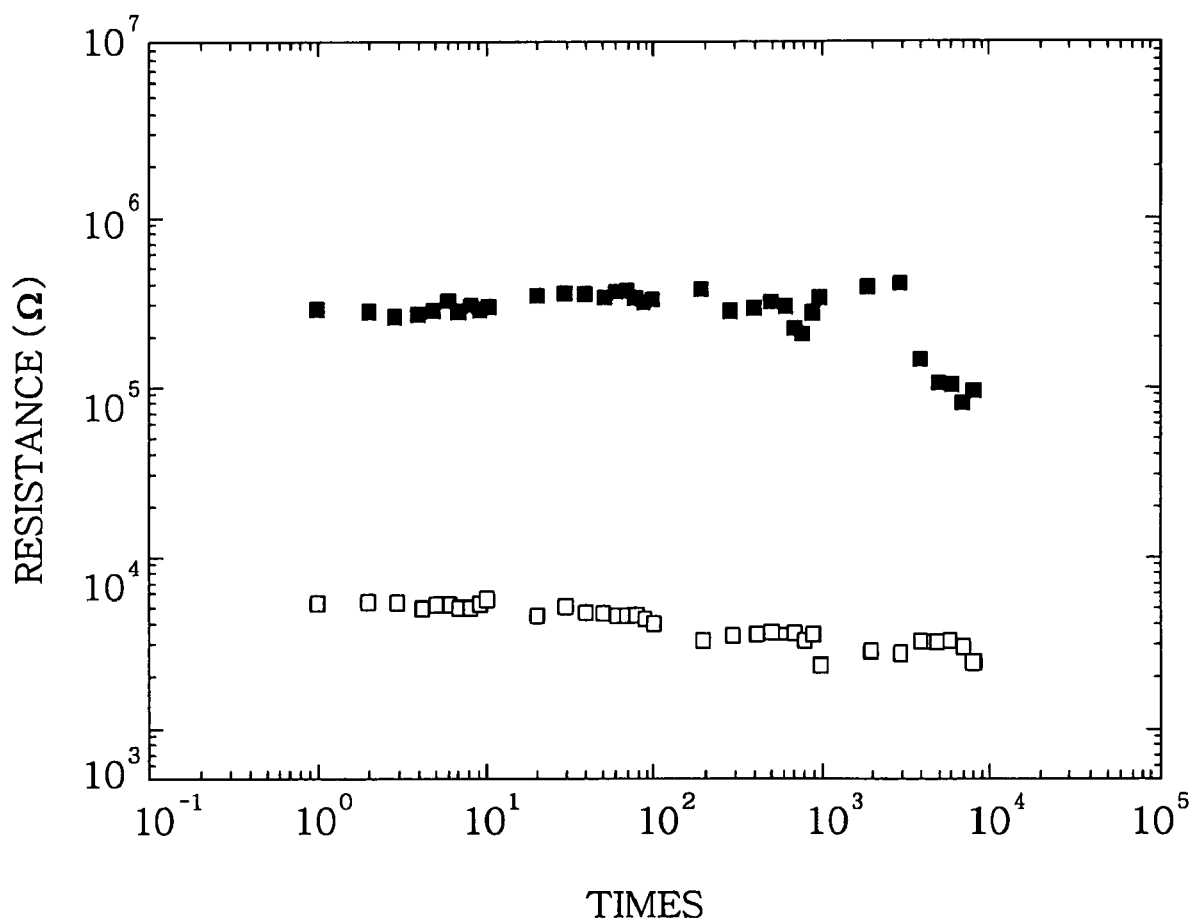
FIG. 8 is a graph illustrating a cycling endurance test result of an initial state of a phase change memory device shown in FIG. 6.

FIG. 8 illustrates a test result of characteristics when writing and erasure operations are repeatedly performed on the same conditions as those of the reset and set operations in FIG. 7. In FIG. 8, an upper side represents a writing endurance test result of the phase change memory device, and a lower side represents an erasure endurance test result of the phase change memory device. It can be seen that the phase change memory device has no problem in characteristic until the writing and erasure operations are performed 3000 times, but reset resistance is decreased since then and becomes ¼ times less than that in the initial state after the writing and erasure operations are performed 8000 times. This means that the phase change memory device is in the unwritable state.

Figure 9:
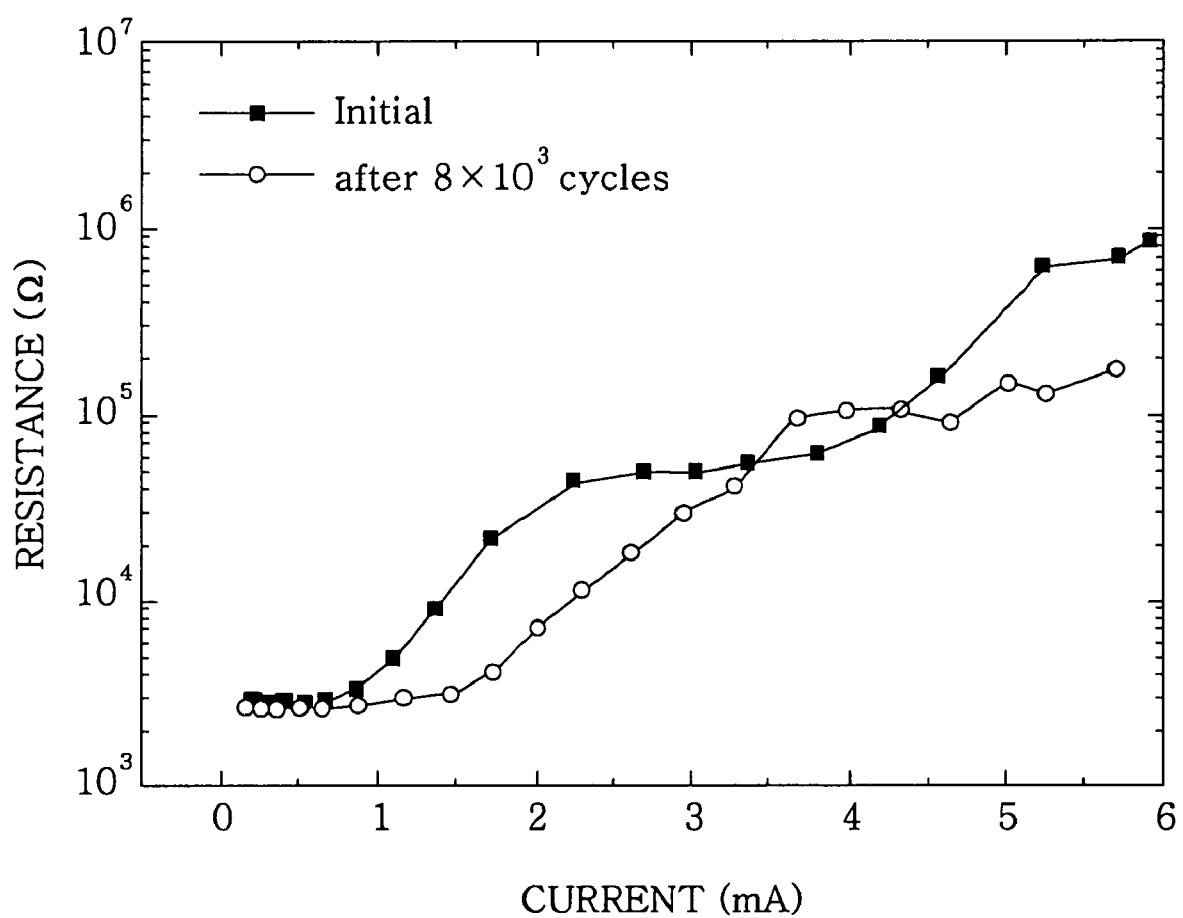
FIG. 9 is a graph illustrating current-resistance characteristics of an initial state (black triangle) of a phase change memory device in shown in FIG. 6 and a state (white circle) of a phase change memory device after a cycling endurance test is conducted 8000 times.

FIG. 9 is a graph illustrating current-resistance characteristic curves when the reset operation is performed in the initial state (black triangle) (see FIG. 7) of the phase change memory device and in the unwritable state (white circle) shown in FIG. 8. Referring to FIG. 9, it can be seen that a reset current is increased in the unwritable state due to the repetition of the writing and erasure operations of the phase change memory device.

Figure 10:
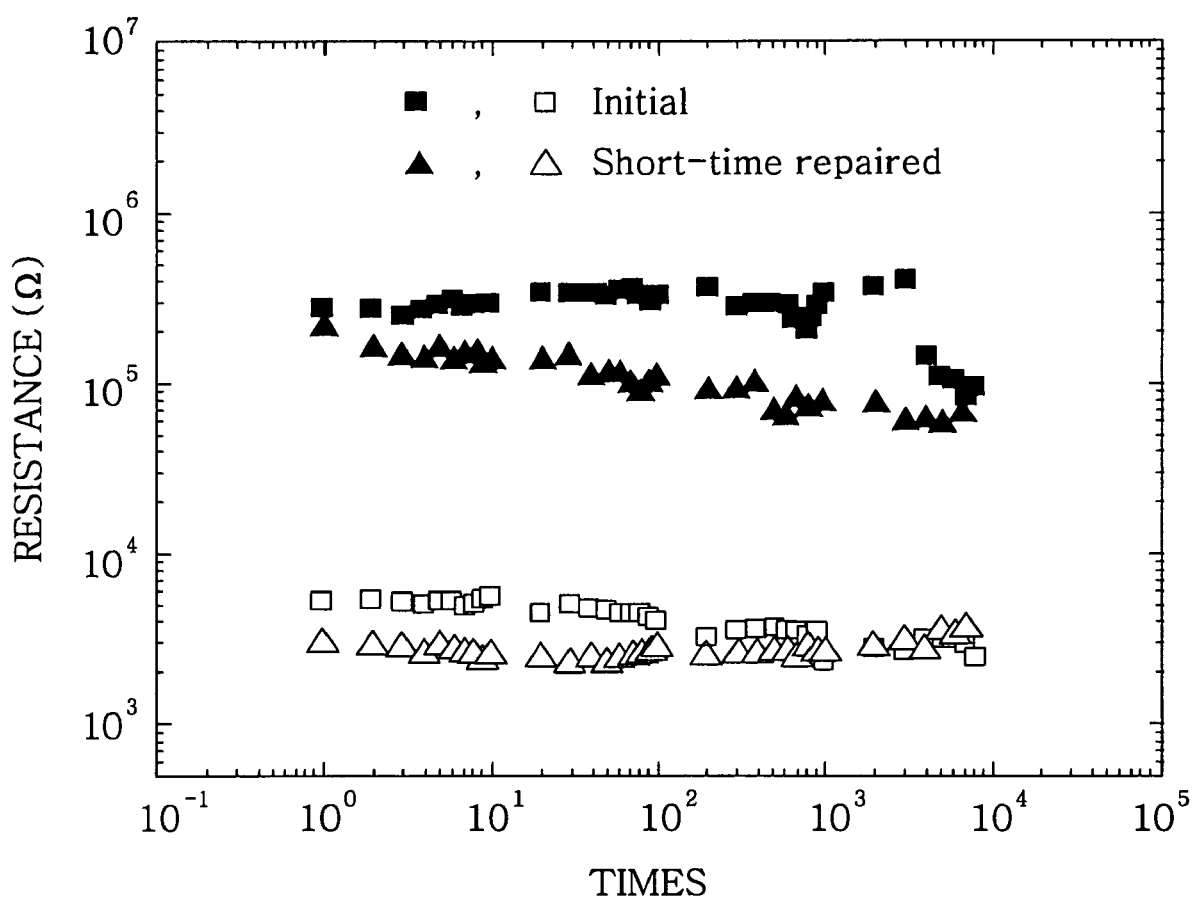
FIG. 10 is a graph illustrating cycling endurance test results of an initial state (black rectangle) of a phase change memory device shown in FIG. 6 and a state in which a cycling endurance test is 8000 times and reset resistance is increased due to a reset current increased by 10% from an initial reset current %, that is, an unwritable state (black triangle).

FIG. 10 illustrates a cycling endurance test result when a cycling endurance test is performed again under the original condition after reset resistance becomes close to that in the initial state by using a reset current larger than the reset current in the initial state by approximately 10% in a state where the phase change memory device is in the unwritable state after the cycling endurance test shown in FIG. 8. In FIG.

10, an upper side represents a writing endurance test result of the phase change memory device, and a lower side represents an erasure endurance test result of the phase change memory device. In FIG. 10, the test is performed in order to check whether or not endurance is repaired to the initial state when reset resistance becomes close to the initial state again by supplying a reset current slightly larger than the normal reset current to the phase change memory device. As a result, it can be seen that the endurance of the phase change memory device in the initial state is not repaired by a slightly large reset current.

Figure 11:
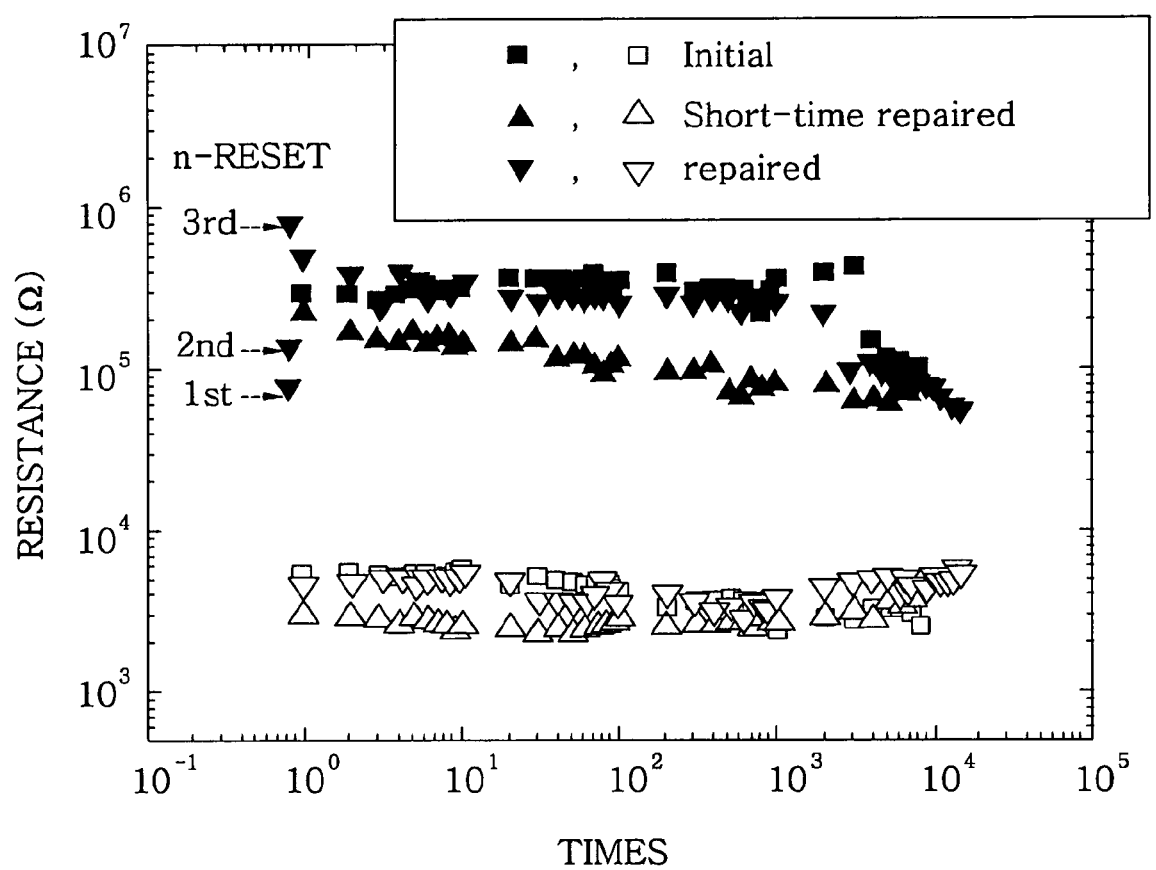
FIG. 11 is a graph illustrating cycling endurance test results of an initial state (black rectangle) and an unwritable state (black triangle) of a phase change memory device shown in FIG. 6, and a repaired state (black inverted triangle) in which a phase change memory device is repaired by a reverse repair current pulse according to the present invention.

FIG. 11 illustrates a cycling endurance test result (black inversed triangle) of the phase change memory device when the reverse repair current pulse shown in FIG. 4c is applied after the cycling endurance test shown in FIG. 10. For comparison, FIG. 11 also illustrates a cycling endurance test result in an initial state (see FIG. 8, black rectangle) of the phase change memory device and a state (see FIG. 10, black triangle) in which the phase change memory device is incompletely repaired by a reset current larger than the operation condition by 10%. As shown in FIG. 4c, the reverse repair current pulse used in this embodiment is opposite to the current during the normal writing and erasure operations, and has a size larger than the normal reset current by 10%. The reverse repair current pulse is applied three times. This is just an example of the reverse repair current pulse according to the present invention, but it is not intended to limit the range of the reverse repair current pulse.

In general, the current of the reverse repair current pulse is opposite direction to the currents for the normal writing and erasure operations, and is of such a size that resultant Joule heat and electromigration cause the movement of the elements of the phase change material.

Further, the reverse repair current pulse has a width equal to or more than a smaller one from the duration of the writing current pulse necessary for the normal reset operation and the duration of the erasure current pulse necessary for the normal set operation.

Figure 12:
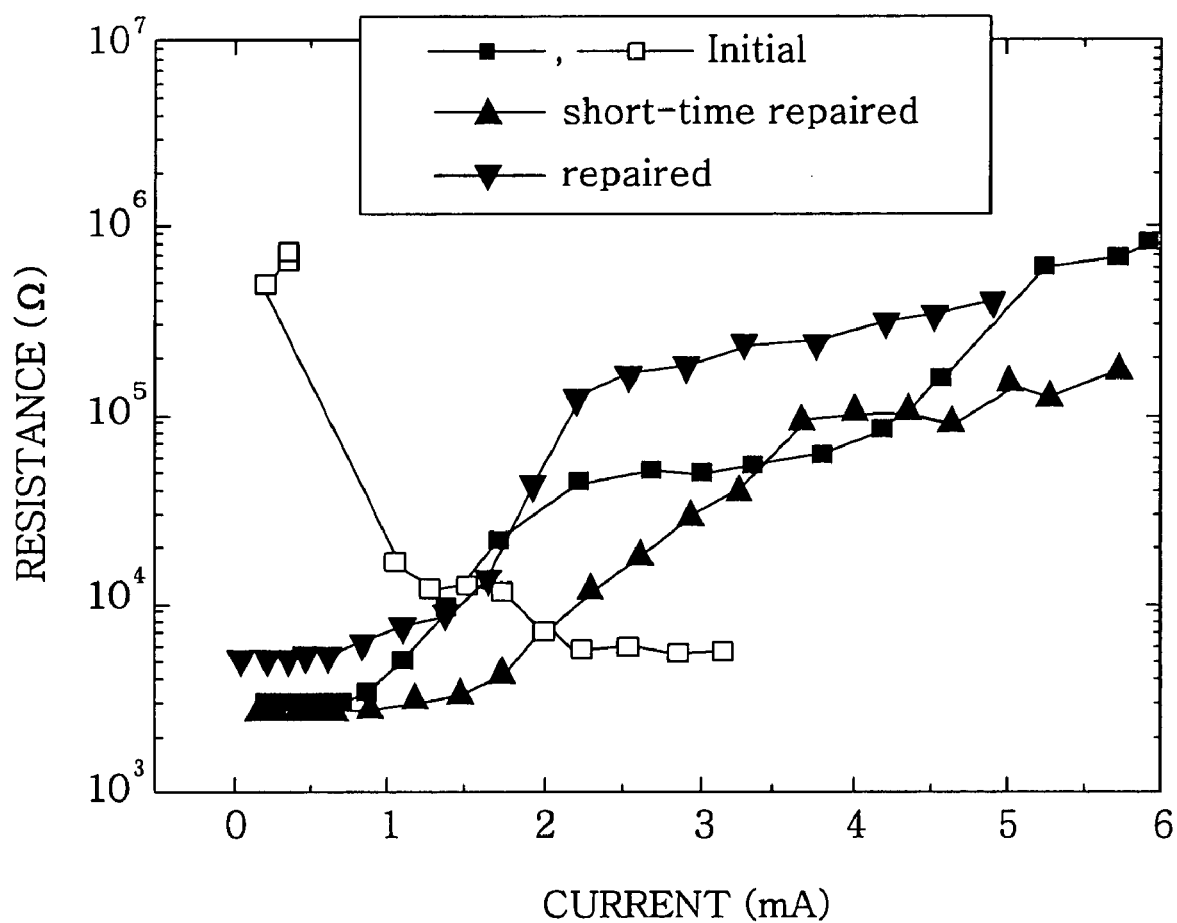
FIG. 12 is a graph illustrating current-resistance characteristics of an initial state (black triangle) and an unwritable state (black regular triangle) of a phase change memory device shown in FIG. 6, and a state (black inverted triangle) in which a phase change memory device is repaired by a reverse repair current pulse according to the present invention.

FIG. 12 is a current-resistance characteristic curve (gray inversed triangle) during the reset operation of the phase change memory device after the reverse repair current pulse according to the present invention is applied. For comparison, FIG. 12 also illustrates current-resistance characteristic curves in the initial state and (see FIG. 7, black rectangle) and the unwritable state (see FIG. 9, black triangle).

As will be apparent from FIG. 12, it can be seen that the reset current is decreased to the reset current in the initial state by the reverse repair current pulse. That is, it can be seen that the phase change memory device in the unwritable state is repaired by the reverse repair current pulse and has the substantially same endurance as the initial state. As a result, it can be seen that the concept of the present invention described with reference to FIGS. 2a and 2b may be successfully applied.

Figure 13:
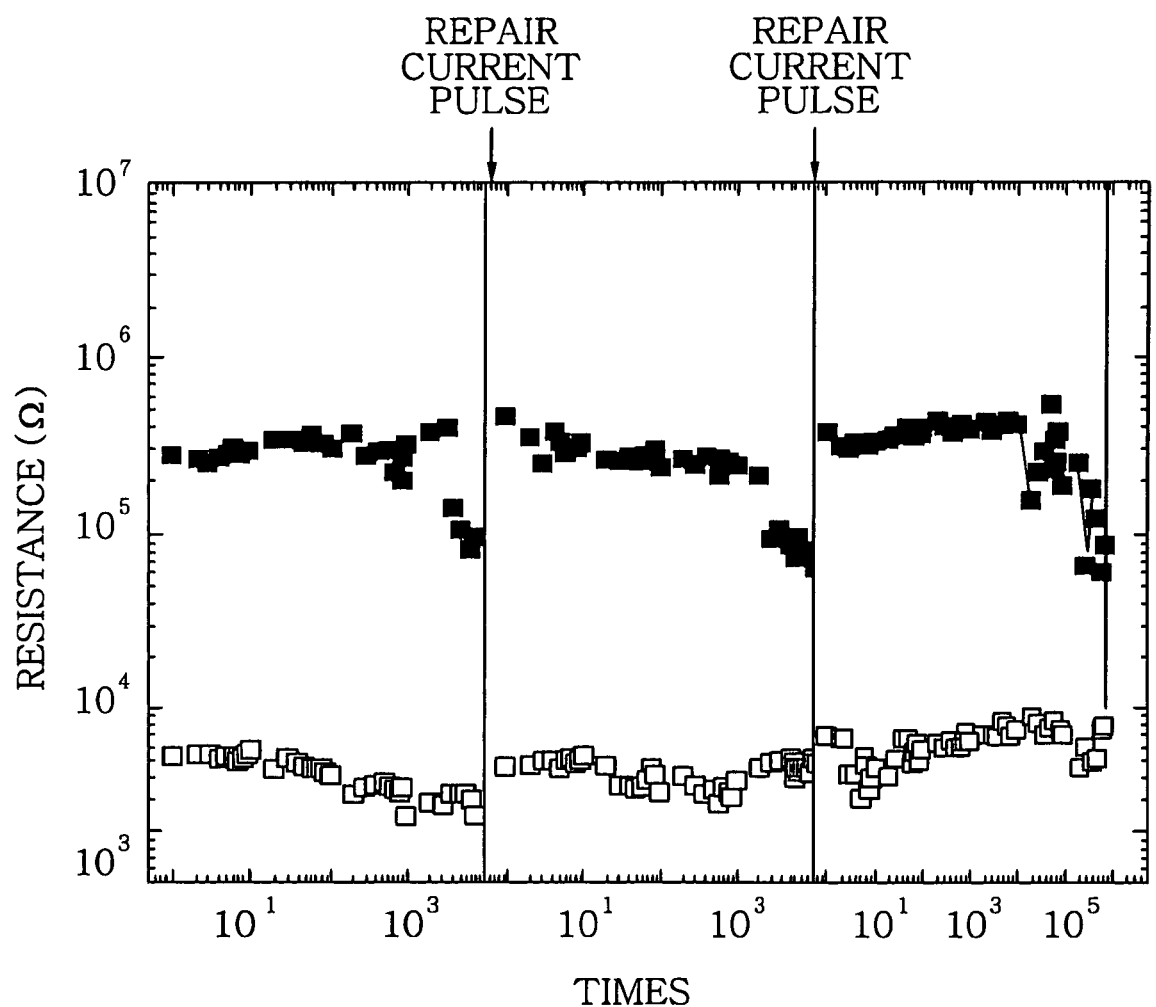
FIG. 13 is a graph illustrating a cycling endurance test result of a phase change memory device by supplying a reverse repair current pulse during normal writing and erasure of a phase change memory device shown in FIG. 5.

In FIG. 13, it is confirmed whether or not the endurance of the phase change memory device is extended when the reverse repair current pulse according to the present invention is supplied while the normal writing and erasure operations are repeatedly performed. In FIG. 13, an upper side represents a writing endurance test result of the phase change memory device, and a lower side represents an erasure endurance test result of the phase change memory device. In the phase change memory device according to the embodiment of the present invention, it can be seen that the cycling endurance is approximately 6000 times in the initial state, and is increased to $2.1 \times 10^5$ when the reverse repair current pulse of the present invention is applied, as compared with FIG. 8.

As described above, the embodiment has been described in the specification and the drawings. The specific terms used herein are just illustrative, but they are not intended to limit the subject matter of the present invention or the scope of the present invention described in the attached claims. It will be understood by those skilled in the art that various modifications and equivalents may be made. Therefore, the scope of the present invention should be defined by the appended claims rather than the description and the drawings.

The invention claimed is:

1. A phase change memory apparatus comprising:
   a phase change memory array having a plurality of phase change memory devices arranged therein; and
   a pulse generator for supplying a writing current pulse, an erasure current pulse, and a reverse repair current pulse to the phase change memory devices in the phase change memory array.

2. The phase change memory apparatus of claim 1, wherein the supplied reverse repair current pulse is an opposite direction to the supplied writing current pulse and the supplied erasure current pulse to the phase change memory devices.

3. The phase change memory apparatus of claim 2, wherein the pulse generator includes a bidirectional pulse generator that supplies current to the phase change memory devices in both directions.

4. The phase change memory apparatus of claim 1, wherein the reverse repair current pulse is of such a size that resultant Joule heat and electromigration cause movement of elements of a phase change material in the phase change memory devices.

5. The phase change memory apparatus of claim 1, wherein the reverse repair current pulse has a width equal to or more than a smaller one of the duration of the writing current pulse of the phase change memory device and the duration of the erasure current pulse.

6. The phase change memory apparatus of claim 1, wherein the reverse repair current pulse is supplied at every predetermined time interval after the writing current pulse or the erasure current pulse is supplied.

7. The phase change memory apparatus of claim 1, wherein the reverse repair current pulse is supplied each time a predetermined number of writing current pulses or erasure current pulses are supplied.

8. A programming method for a phase change memory apparatus having a plurality of phase change memory devices, the programming method comprising:
   supplying writing and erasure current pulses for writing and erasure operations of the phase change memory devices; and
   selectively supplying a reverse repair current pulse having a polarity opposite to those of the writing current pulse and the erasure current pulse.

9. The programming method of claim 8, wherein the reverse repair current pulse has a width equal to or more than a smaller one from the duration of the writing current pulse or the duration of the erasure current pulse to the phase change memory devices.

10. The programming method of claim 8, wherein the reverse repair current pulse is of such a size that resultant Joule heat and electromigration cause movement of elements of a phase change material in the phase change memory devices.

11. The programming method of claim 8, wherein the reverse repair current pulse is supplied at every predetermined time interval after the writing current pulse or the erasure current pulse.

12. The programming method of claim 8, wherein the reverse repair current pulse is supplied each time a predetermined number of writing current pulses or erasure current pulses are supplied.

13. The programming method of claim 8, wherein reset resistance caused by the writing current pulse during the writing or erasure operation according to the writing or erasure current pulse to the phase change memory devices is read at every predetermined time interval, and it is determined on the reset resistance whether or not to apply the reverse repair current pulse.

* * * * *